(12) United States Patent
Hong et al.

(10) Patent No.: US 10,459,557 B2
(45) Date of Patent: Oct. 29, 2019

(54) DISPLAY DEVICE (71) Applicant: Samsung Display Co., Ltd., Yongin-si, Gyeonggi-do (KR)

(72) Inventors: Jung Moo Hong, Yongin-si (KR); Sun Haeng Cho, Yongin-si (KR); Kyu Young Kim, Yongin-si (KR); Jin Bo Shim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 33 days.

(21) Appl. No.: 15/617,936

(22) Filed: Jun. 8, 2017

(65) Prior Publication Data

US 2018/0095570 A1 Apr. 5, 2018

(30) Foreign Application Priority Data

Sep. 30, 2016 (KR) .................. 10-2016-0126615

(51) Int. Cl.
- *G06F 3/041* (2006.01)
- *G06F 3/044* (2006.01)
- *H01L 27/32* (2006.01)
- *H01L 51/52* (2006.01)

(52) U.S. Cl.
CPC ............ *G06F 3/0412* (2013.01); *G06F 3/044* (2013.01); *H01L 27/323* (2013.01); *H01L 27/3246* (2013.01); *H01L 51/5284* (2013.01); *G06F 2203/04103* (2013.01); *G06F 2203/04112* (2013.01); *H01L 27/322* (2013.01); *H01L 51/5253* (2013.01)

(58) Field of Classification Search
CPC .................. G06F 3/0412; G06F 3/044; G06F 2203/04103; G06F 2203/04112; H01L 27/323; H01L 27/322; H01L 27/3246; H01L 51/5253; H01L 51/5284
See application file for complete search history.

(56) References Cited

U.S. PATENT DOCUMENTS

| | | | |
|---|---|---|---|
| 8,686,308 B2 | 4/2014 | Kuriki | |
| 9,335,881 B2 | 5/2016 | Jeong | |
| 2012/0273336 A1* | 11/2012 | Kuriki | G06F 3/044 200/600 |
| 2014/0131668 A1* | 5/2014 | Kim | H01L 51/56 257/40 |
| 2015/0048358 A1* | 2/2015 | Tsuchiya | H01L 27/3276 257/40 |
| 2016/0204183 A1* | 7/2016 | Tao | H01L 51/0097 257/40 |
| 2016/0274398 A1* | 9/2016 | Hirakata | G06F 3/0416 |
| 2018/0026079 A1 | 1/2018 | Lee et al. | |
| 2018/0088726 A1* | 3/2018 | Gwon | G06F 3/0412 |

FOREIGN PATENT DOCUMENTS

KR 10-2018-0011919 2/2018

* cited by examiner

*Primary Examiner* — Sahlu Okebato
(74) *Attorney, Agent, or Firm* — Lewis Roca Rothgerber Chirstie LLP (57) ABSTRACT

A display device includes: a plurality of light emitting elements; a pixel definition layer having a plurality of openings defining positions of the light emitting elements; an encapsulation layer on the light emitting elements and the pixel definition layer; an insulation layer on the encapsulation layer and having a smaller width than a portion of the pixel definition layer between two adjacent openings therein; and a plurality of touch sensing cells on the insulation layer.

16 Claims, 7 Drawing Sheets

DISPLAY DEVICE

CROSS-REFERENCE TO RELATED APPLICATION

This application claims priority to and the benefit of Korean Patent Application No. 10-2016-0126615, filed in the Korean Intellectual Property Office on Sep. 30, 2016, the entire content of which is incorporated herein by reference.

BACKGROUND

1. Field

Aspects of exemplary embodiments of the present invention relate to a display device.

2. Description of the prior art

With the development of information technology, display devices serving to interconnect a user and information have been receiving attention. Correspondingly, the use of display devices, such as liquid crystal displays (LCDs) and organic light-emitting diode (OLED) displays, has been increasing.

In general, a display device may display an image by using a plurality of pixels and may include a black matrix covering areas other than light emitting areas of the pixels.

In this case, a distance between the light emitting areas of the pixels and the black matrix is an important factor, which at least partially determines a viewing angle of the display device.

SUMMARY

Exemplary embodiments of the present invention provide a display device that maintains touch sensitivity while having an improved viewing angle characteristic.

A display device according to an exemplary embodiment of the present invention includes: a plurality of light emitting elements, a pixel definition layer having a plurality of openings defining positions of the light emitting elements, an encapsulation layer on the light emitting elements and the pixel definition layer, an insulation layer on the encapsulation layer and having a smaller width than a portion of the pixel defining layer between two adjacent openings therein; and touch sensing cells on the insulation layer.

The insulation layer may overlap the pixel definition layer.

The display device may further include a black matrix that has a greater width than the insulation layer and may cover the insulation layer and the touch sensing cells.

The black matrix may overlap the pixel definition layer.

The display device may further include a plurality of color filters on the encapsulation layer and the black matrix.

Adjacent ones of the color filters may contact each other on the black matrix.

Each of the light emitting elements may include a first electrode exposed through one of the openings in the pixel definition layer, an emission layer on the first electrode, and a second electrode on the emission layer.

The touch sensing cells may include a plurality of first touch sensing cells connected to each other by first connection patterns along a first direction and a plurality of second touch sensing cells connected to each other by second connection patterns along a second direction.

The second connection patterns may be below the insulation layer and may be connected to the second touch sensing cells through contact openings in the insulation layer.

The insulation layer may include an organic insulating layer.

The display device may further include a buffer layer between the encapsulation layer and the insulation layer.

The touch sensing cells may include conductive lines having a mesh shape.

The conductive lines of the touch sensing cells may have a smaller width than the insulation layer.

The insulation layer may not overlap a first electrode of the light emitting element.

The insulation layer may have a mesh shape.

The first and second touch sensing cells and the first and second connection patterns may overlap (or may entirely overlap) the insulation layer.

The first and second touch sensing cells and the first and second connection patterns may overlap the insulation layer when viewed on a plane and may have substantially the same shape as the insulation layer.

According to exemplary embodiments of the present invention, a display device maintaining touch sensitivity while having an improved viewing angle characteristic is provided.

DETAILED DESCRIPTION

Aspects and features of the present invention and methods for achieving them will become apparent with reference to exemplary embodiments thereof described, in detail, below in conjunction with the accompanying drawings. However, the present invention may be embodied in many different forms and should not be construed as being limited to the exemplary embodiments set forth herein.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements. To more clearly describe aspects and features of present invention, parts that are not necessary for one skilled in the art to have a complete understanding of the present invention may be omitted, and like reference numerals designate like elements throughout the specification.

As used herein, the term "and/or" includes any and all combinations of one or more of the associated listed items. Further, the use of "may" when describing embodiments of the present invention relates to "one or more embodiments of the present invention." Expressions, such as "at least one of," when preceding a list of elements, modify the entire list of elements and do not modify the individual elements of the list. Also, the term "exemplary" is intended to refer to an example or illustration.

As used herein, the terms "use," "using," and "used" may be considered synonymous with the terms "utilize," "utilizing," and "utilized," respectively.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments. In the figures, dimensions of the various elements, layers, etc. may be exaggerated for clarity of illustration.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing particular example embodiments of the present invention and is not intended to be limiting of the described example embodiments of the present invention. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

A display device according to exemplary embodiments of the present invention will now be described with reference to the accompanying drawings.

Figure 1:
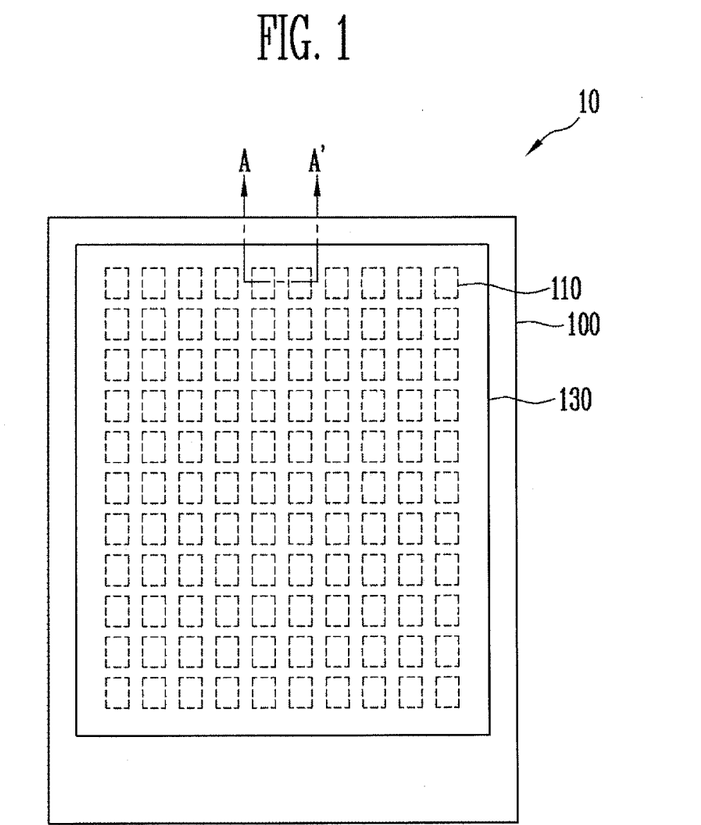
FIG. 1 shows some components of a display device according to an exemplary embodiment of the present invention.

FIG. 1 shows some components of a display device according to an exemplary embodiment of the present invention.

Referring to FIG. 1, the display device 10 according to an exemplary embodiment of the present invention may include a substrate 100, light emitting elements 110, and an encapsulation layer 130.

The substrate 100 may be made of an insulating material, such as glass or a resin. In some embodiments, the substrate 100 may be made of a flexible material, such that it is bendable or foldable, and may have a single-layer or multi-layer structure.

For example, the substrate 100 may include polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and/or cellulose acetate propionate. However, the substrate 100 may be variously changed or suitably modified and may be made of fiberglass reinforced plastic (FRP) or the like.

The light emitting elements 110 may be disposed on the substrate 100 and may emit light having specific colors to provide an image (e.g., a predetermined image) to a user.

The encapsulation layer 130 may be formed on the light emitting elements 110 to protect the light emitting elements 110. For example, the encapsulation layer 130 may prevent the light emitting elements 110 from being damaged by exposure to moisture and oxygen.

Figure 2:
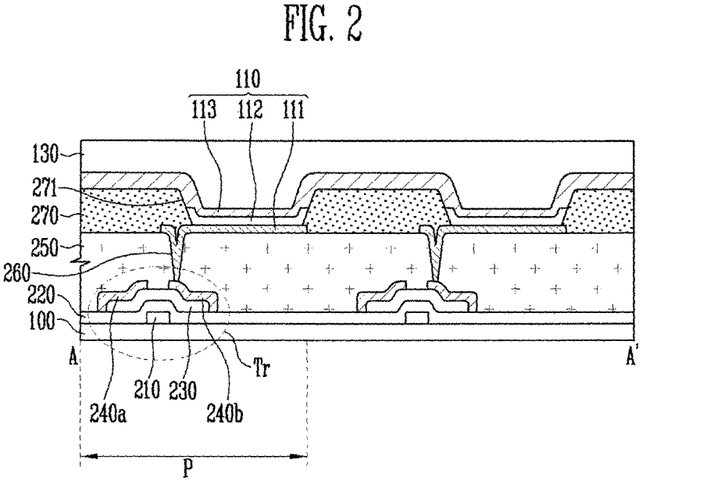
FIG. 2 is a cross-sectional view taken along the line A-A' of FIG. 1 according to an embodiment of the present invention.

FIG. 2 is a cross-sectional view taken along the line A-A' of FIG. 1 according to an embodiment of the present invention.

Referring to FIG. 2, the light emitting element 110 according to an exemplary embodiment of the present invention may include a first electrode 111, an emission layer 112, and a second electrode 113.

The emission layer 112 may be disposed between the first electrode 111 and the second electrode 113. In addition, the first electrode 111 and the second electrode 113 may respectively act as an anode and a cathode.

For example, in some embodiments, the emission layer 112 includes an organic emission layer that can emit light by itself (e.g., that is self-emissive).

In such an embodiment, the emission layer 112 may be formed to have a structure in which a hole transporting layer (HTL), an organic emission layer, and an electron transporting layer (ETL) are laminated. In some embodiments, the emission layer 112 may further include a hole injection layer (HIL) and an electron injection layer (EIL).

According to the above-described structure, holes injected from the first electrode 111 and electrons injected from the second electrode 113 are combined in the organic emission layer (e.g., in the emission layer 112) to generate excitons, and light having certain wavelengths is emitted from each of the emission layers 112 due to energy from the generated excitons.

A plurality of pixels P may be disposed on the substrate 100. In such an embodiment, each of the pixels P may include a pixel circuit including a driving transistor Tr and one of the light emitting elements 110.

For ease of description, only the driving transistor Tr directly associated with the light emitting element 110 of one pixel P is shown in FIG. 2, but the pixel circuit may further include other transistors and capacitors in addition to the driving transistor Tr to control the emission of the light emitting element 110.

A buffer layer may be provided on the substrate 100 to prevent diffusion of impurities included in the substrate 100. In such an embodiment, the buffer layer may be formed as a single layer or multiple layers.

The driving transistor Tr is formed on the substrate 100, and one driving transistor Tr may be provided to correspond to each light emitting element 110 (e.g., there may be a one-to-one correspondence between the driving transistors Tr and the light emitting elements 110).

The driving transistor Tr may include a gate electrode 210, a gate insulating layer 220, a semiconductor layer 230, and source/drain electrodes 240a and 240b.

The gate electrode 210 may be formed on the substrate 100.

The gate insulating layer 220 may be formed on the gate electrode 210. For example, the gate insulating layer 220 may be formed of an insulating material, such as silicon oxide ($SiO_x$) or silicon nitride ($SiN_x$).

The semiconductor layer 230 may be formed on the gate insulating layer 220. For example, the semiconductor layer 230 may be formed of polysilicon, which is amorphous silicon that is crystallized using a laser or the like.

In some embodiments, the semiconductor layer 230 may be formed of or may be amorphous silicon, oxide semiconductor, etc., in addition to polysilicon.

The source/drain electrodes 240a and 240b may be positioned at opposite sides of the semiconductor layer 230.

A planarization layer 250 may be disposed on the driving transistor Tr and may include a contact opening 260 (e.g., a contact hole) that exposes the source electrode 240a or the drain electrode 240b. FIG. 2 shows an embodiment in which the drain electrode 240b is exposed by the contact opening 260.

The gate electrode 210 and the source/drain electrodes 240a and 240b may be formed of a metal, such as molybdenum (Mo), tungsten (W), titanium (Ti), aluminum (Al), etc., and/or alloys of these metals or may be formed to have a structure in which these metals are laminated, but the gate electrode 210 and the source/drain electrodes 240a and 240b are not limited thereto.

In addition, the driving transistor Tr is not limited to the structure shown in FIG. 2 and may be modified to have a different structure. For example, FIG. 2 shows that the transistor Tr has a bottom-gate structure, but the transistor Tr may have a top-gate structure in another embodiment.

The first electrode 111 is formed on the planarization layer 250, and the first electrode 111 may be connected to the source electrode 240a or the drain electrode 240b through the contact opening 260. FIG. 2 shows an embodiment in which the first electrode 111 is connected to the drain electrode 240b through the contact opening 260.

For example, the planarization layer 250 may be formed of an insulating material, such as a silicon oxide or a silicon nitride.

A pixel definition layer 270 may be disposed on the planarization layer 250 and may define positions of the light emitting elements 110.

To define the positions of the light emitting elements 110, the pixel definition layer 270 may expose at least some of (e.g., at least portions of) the first electrode 111.

For example, a plurality of openings 271 may be provided in the pixel definition layer 270, and the first electrodes 111 of the light emitting elements 110 may be respectively exposed through the openings 271.

For example, the pixel definition layer 270 may be made of an organic insulating material, such as an acrylic organic compound, polyamide, polyimide, and the like. However, the pixel definition layer 270 is not limited thereto and may be made of various suitable insulating materials.

In addition, as described above, the emission layer 112 and the second electrode 113 may be sequentially disposed on the first electrode 111.

In some embodiments, the second electrode 113 may extend along (or over) the pixel definition layer 270 such that it is connected to the second electrode 113 of the adjacent light emitting element 110. For example, the second electrodes 113 of the light emitting elements 110 may be connected to each other (e.g., the second electrode 113 may be common to some or all of the light emitting elements 110).

The pixel definition layer 270 may define the positions of the light emitting elements 110 by the openings 271 that determine positions of the first electrodes 111.

The encapsulation layer 130 may be disposed on the light emitting elements 110. For example, the encapsulation layer 130 may be disposed on the second electrode 113.

In addition, the encapsulation layer 130 may be formed to have a structure in which a plurality of layers are laminated. For example, the encapsulation layer 130 may include an organic layer and an inorganic layer. When the encapsulation layer 130 has a multi-layered structure, a plurality of organic and inorganic layers may be alternately laminated on each other.

Figure 3:
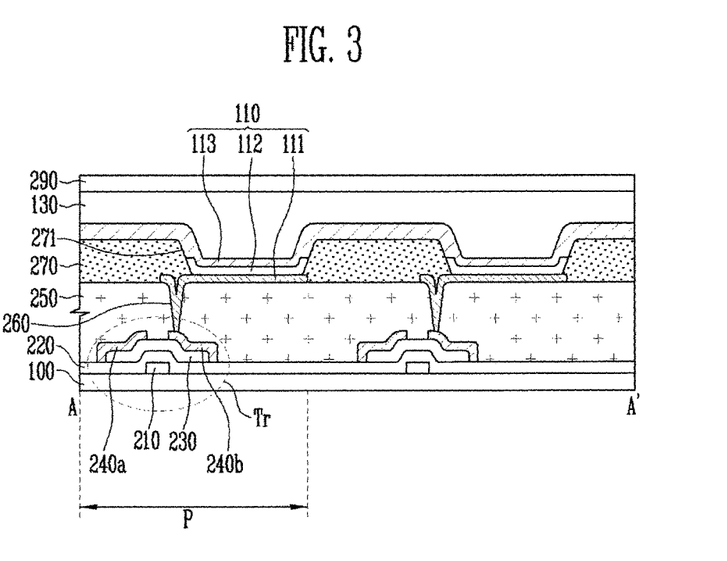
FIG. 3 is a cross-sectional view taken along the line A-A' of FIG. 1 of another embodiment of the present invention including a buffer layer.

FIG. 3 is a cross-sectional view taken along the line A-A' of FIG. 1 according to another embodiment of the present invention.

Referring to FIG. 3, the display device 10 according to the current exemplary embodiment of the present invention may further include a buffer layer 290 that is disposed on the encapsulation layer 130.

The buffer layer 290 may be disposed such that the encapsulation layer 130 and the light emitting elements 110 are protected when forming components associated with a touch sensor (or touch panel), to be further described later.

For example, the buffer layer 290 may include an organic insulating material. In some embodiments, the buffer layer 290 may be integrally formed with the encapsulation layer 130, and in other embodiments, the buffer layer 290 may be omitted.

Figure 4:
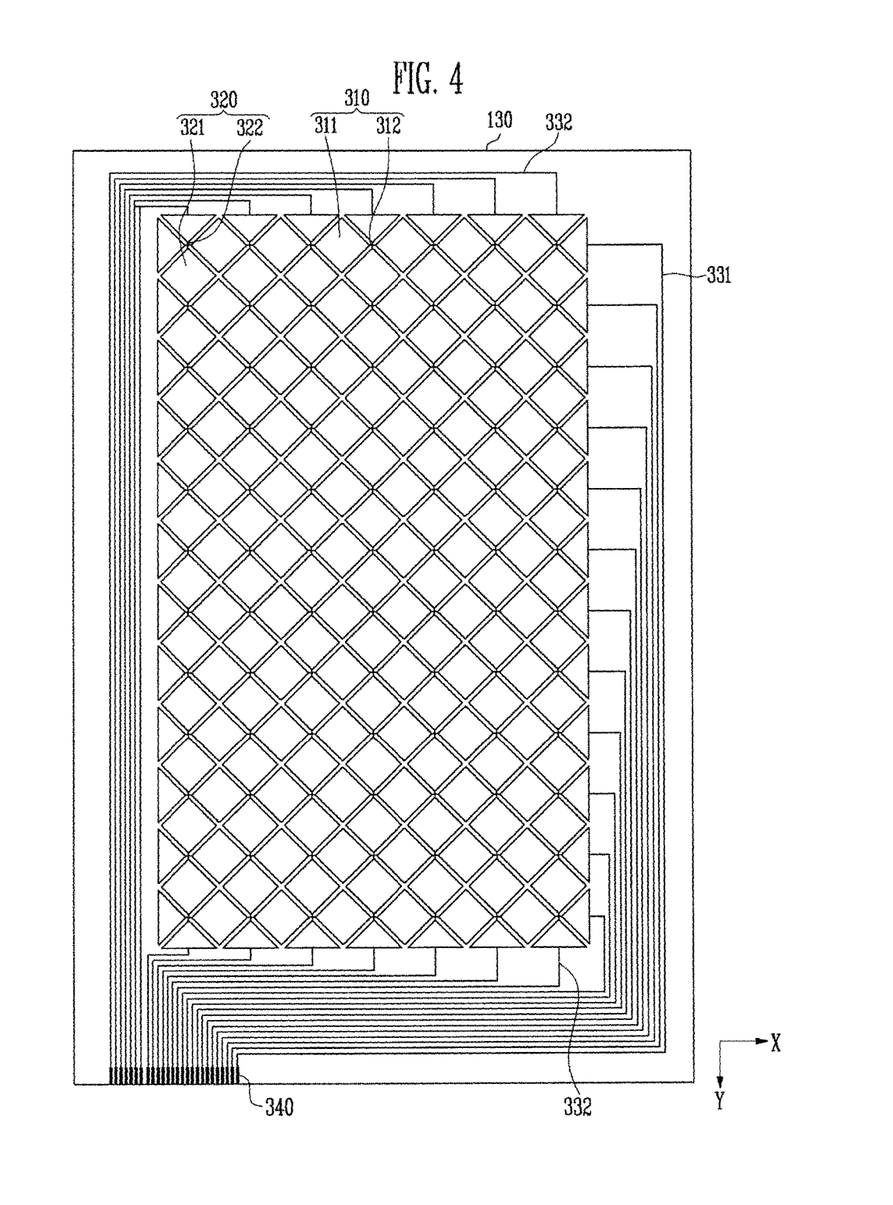
FIG. 4 shows touch electrodes according to an exemplary embodiment of the present invention.

FIG. 4 shows touch electrodes according to an exemplary embodiment of the present invention.

Referring to FIG. 4, the display device 10 according to the current exemplary embodiment of the present invention may include first touch electrodes 310 and second touch electrodes 320 that together form a touch sensor (or touch panel).

The first touch electrodes 310 and the second touch electrodes 320 may be disposed on the encapsulation layer 130 of the display device 10. When the buffer layer 290 is provided on the encapsulation layer 130, the first touch electrodes 310 and the second touch electrodes 320 may be disposed on the buffer layer 290.

The first touch electrodes 310 may be formed to extend in a first direction (e.g., X-axis direction) such that a plurality of the first touch electrodes 310 are arranged (e.g., are adjacent each other) along a second direction (e.g., Y-axis direction) crossing the first direction.

The second touch electrodes 320 may be formed to extend in the second direction (e.g., Y-axis direction) such that a plurality of the second touch electrodes 320 are arranged (e.g., are adjacent each other) along the first direction (e.g., X-axis direction).

The first touch electrodes 310 and the second touch electrodes 320 may be positioned to cross each other such that they operate as a capacitive-type touch sensor.

For example, mutual capacitance exists between the first touch electrodes 310 and the second touch electrodes 320, and when a touch occurs to the display device 10, the mutual capacitance at the point where the touch occurs changes. Such a change in the mutual capacitance may be used to detect the touch position.

Each of the first touch electrodes 310 may include a plurality of first touch sensing cells 311 that are arranged at intervals (e.g., at predetermined intervals) along the first direction (e.g., the X-axis direction) and a plurality of first connection patterns 312 that electrically connect the first touch sensing cells 311 to each other.

In addition, each of the second touch electrodes 320 may include a plurality of second touch sensing cells 321 that are arranged at intervals (e.g., at predetermined intervals) along the second direction (e.g., the Y-axis direction) and a plurality of second connection patterns 322 that electrically connect the second touch sensing cells 321 to each other.

In such embodiments, the second touch sensing cells 321 may be disposed to be distributed between (e.g., may be arranged between) the first touch sensing cells 311 such that they do not overlap the first touch sensing cells 311.

FIG. 4 shows an embodiment in which the first touch sensing cells 311 and the second touch sensing cells 321 have a polygonal shape, but the shapes of the first touch sensing cells 311 and the second touch sensing cells 321 may be variously modified.

First wires 331 may be connected between the first touch electrodes 310 and pads 340, and second wires 332 may be connected between the second touch electrodes 320 and the pads 340.

In addition, the wires 331 and 332 may be connected to an external touch controller through the pads 340.

For example, in some embodiments, the touch controller may provide driving signals to the first touch electrodes 310 and may detect the touch position by using sensing signals that are outputted from the second touch electrodes 320.

In other embodiments, the touch controller may provide driving signals to the second touch electrodes 320 and may receive sensing signals from the first touch electrodes 310.

In order to improve touch sensitivity, the first wires 331 and/or the second wires 332 may have a double routing structure.

FIG. 4 exemplarily shows that the second wires 332 connected to the second touch electrodes 320 are formed to have the double routing structure. For example, the second wires 332 may be respectively connected to opposite ends of the second touch electrodes 320.

In addition, as shown in FIG. 4, the first wires 331 may have the single routing structure in which they are connected to only one end of the first touch electrodes 310. However, the routing structures of the first wires 331 and the second wires 332 may be variously modified.

For example, in other embodiments, both the first wires 331 and the second wires 332 may have the single routing structure or the double routing structure, or the first wires 331 may have the double routing structure while the second wires 332 may have the single routing structure.

The first touch electrodes 310 and the second touch electrodes 320 may include a conductive material. For example, the first touch electrodes 310 and the second touch electrodes 320 may include metal or metal alloys. Examples of the metal may include gold (Au), silver (Ag), aluminum (Al), molybdenum (Mo), chromium (Cr), titanium (Ti), nickel (Ni), neodymium (Nd), copper (Cu), platinum (Pt), and the like.

In some embodiments, the first touch electrodes 310 and the second touch electrodes 320 may be made of a transparent conductive material. Examples of the transparent conductive material may include silver nanowire (AgNW), indium tin oxide (ITO), indium zinc oxide (IZO), antimony zinc oxide (AZO), indium tin zinc oxide (ITZO), zinc oxide (ZnO), tin oxide (SnO2), carbon nanotube (CNT), graphene, and the like. The first touch electrodes 310 and the second touch electrodes 320 may respectively be formed as a single layer or multiple layers.

The first touch electrodes 310 and the second touch electrodes 320 may be made of the same material or may be made of different materials.

Figure 5A:
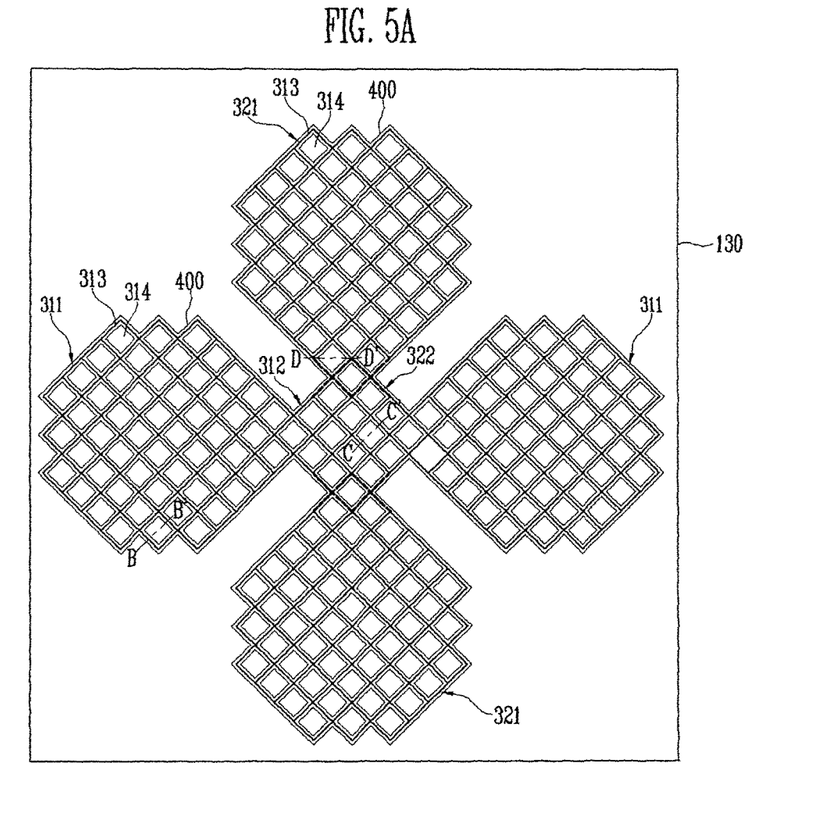
FIG. 5A is a more detailed view of the touch electrodes shown in FIG. 4.
Figure 5B:
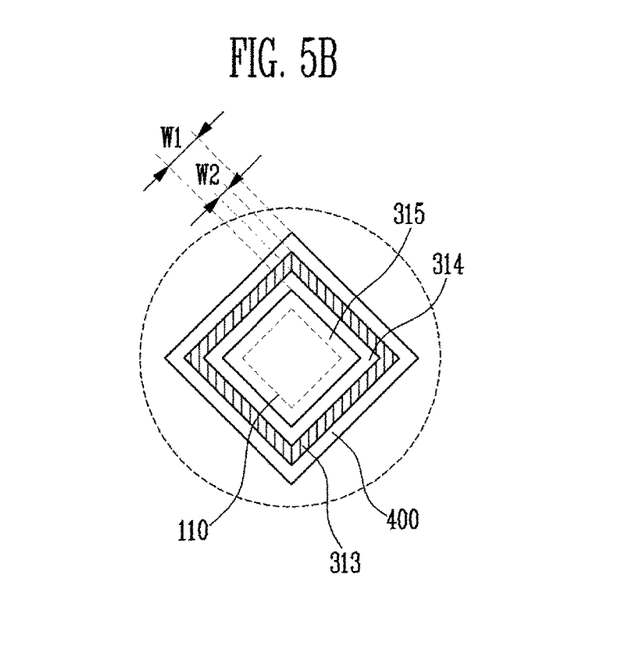
FIG. 5B is an enlarged view of a region of FIG. 5A.

FIG. 5A is a more detailed view of the touch electrodes shown in FIG. 4, and FIG. 5B is an enlarged view of a region of FIG. 5A.

In FIG. 5A, a pair of the first touch sensing cells 311, one of the first connection patterns 312 between and connecting the pair of the first touch sensing cells 311 to each other, a pair of the second touch sensing cells 321, and one of the second connection patterns 322 between and connecting the pair of the second touch sensing cells 321 to each other are shown.

Referring to FIG. 5A, the first touch sensing cells 311 may have a mesh structure (or mesh shape) including (or defining) openings 314.

For example, the first touch sensing cells 311 may be formed of conductive lines 313 that form (or define) the openings 314.

The first connection pattern 312 may be connected between adjacent ones of the first touch sensing cells 311. In some embodiments, the first connection pattern 312 may also have the mesh structure (or mesh shape) including (or defining) the openings 314, substantially similar to or the same as the first touch sensing cells 311.

For example, the first connection pattern 312 may include (or may be formed of) the conductive lines 313 that form (or define) the openings 314.

In addition, the second connection pattern 322, which is connected to and between adjacent ones of the second touch sensing cells 321, may also have the mesh structure (or mesh shape) including (or defining) the openings 314.

For example, the second touch sensing cells 321 and the second connection pattern 322 may include the conductive lines 313 that respectively form (or define) the openings 314.

Shapes of the first connection pattern 312 and the second connection pattern 322, as well as shapes of the first touch sensing cells 311 and the second touch sensing cells 321, may be variously modified.

Referring to FIGS. 5A and 5B, the display device 10 according to the current exemplary embodiment of the present invention may further include an insulation layer 400.

The insulation layer 400 may be disposed to overlap the first touch electrodes 310 and the second touch electrodes 320.

In addition, the insulation layer 400 may have a mesh structure (or mesh shape) including (or defining) openings 315.

For example, the touch electrodes 310 and 320 may overlap (e.g., may completely overlap) the insulation layer 400.

In addition, when viewed on a plane, the touch electrodes 310 and 320 may overlap the insulation layer 400 and have substantially the same shape as the insulation layer 400. For example, the first touch sensing cells 311 and the second touch sensing cells 321 may be disposed above (or on) the insulation layer 400.

In addition, the first connection pattern 312 may be disposed above (or on) the insulation layer 400 and may be integrally formed with the first touch sensing cells 311. In such an embodiment, the second connection pattern 322 may be disposed below (or under) the insulation layer 400 and may be connected to the second touch sensing cells 321 through a contact opening formed in the insulation layer 400.

The conductive lines 313 forming the first touch sensing cells 311, the first connection patterns 312, the second touch sensing cells 321, and the second connection patterns 322 may overlap the insulation layer 400, which has the mesh structure (or mesh shape).

In addition, a width W2 of the conductive lines 313 may be smaller than a width W1 of the insulation layer 400.

Accordingly, the openings 315 of (or defined by) the insulation layer 400 may have a smaller size than the openings 314 of (or defined by) the conductive lines 313. In such an embodiment, the openings 314 formed by (or defined by) the touch electrodes 310 and 320 may respectively overlap the light emitting elements 110.

Because the emission layers 112 of the light emitting elements 110 do not overlap the touch electrodes 310 and 320, light emitted from the light emitting elements 110 may not be blocked by the touch electrodes 310 and 320.

The insulation layer 400 may be implemented as an organic insulating layer including an organic material or as an inorganic insulating layer including an inorganic material.

Figure 6A:
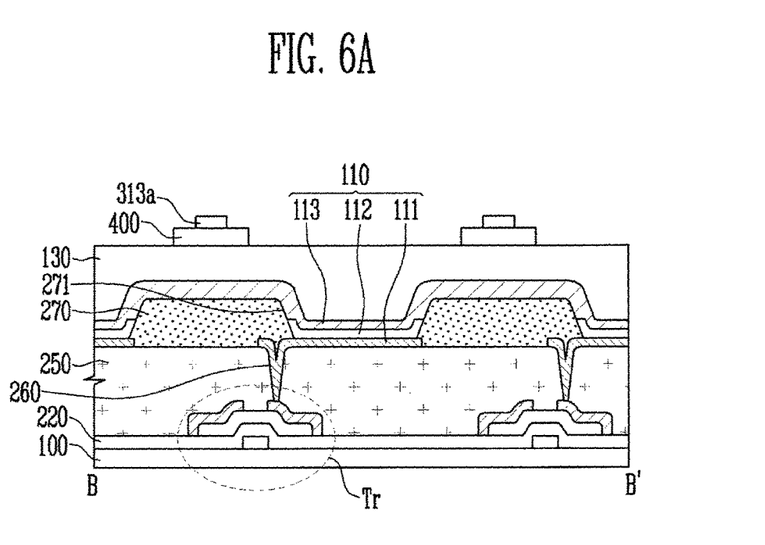
FIGS. 6A-6C show cross-sections of FIG. 5A along the lines B-B', C-C', and D-D', respectively.
Figure 6B:
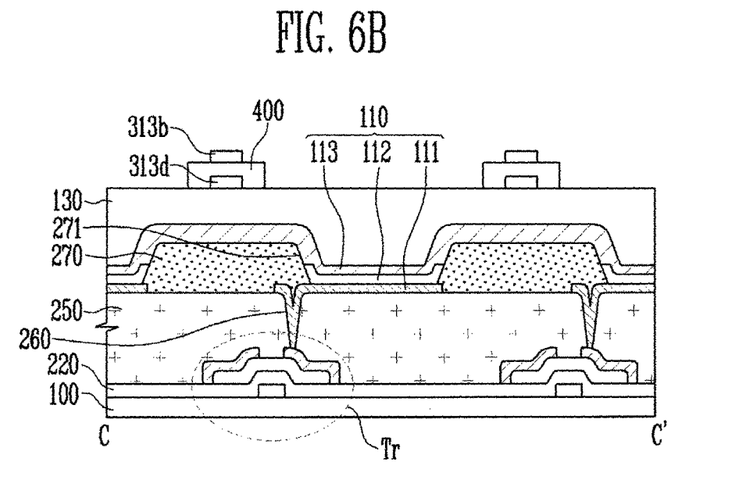
Figure 6C:
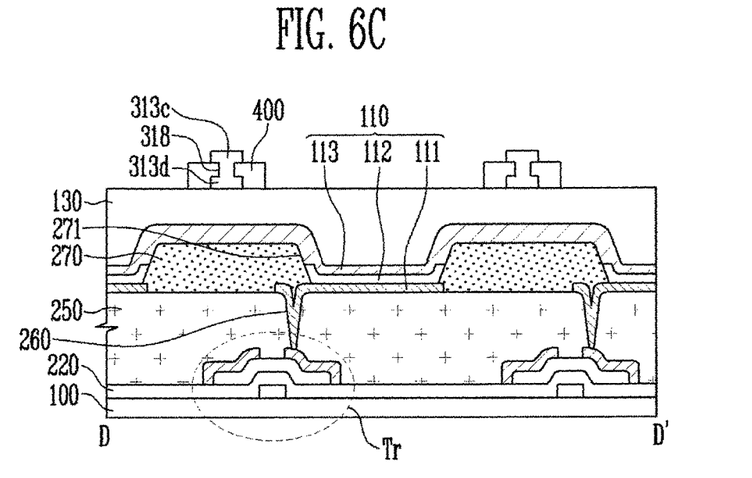

FIGS. 6A-6C are cross-sectional views of FIG. 5A. For example, FIG. 6A is a cross-sectional view taken along the line B-B' of FIG. 5A, FIG. 6B is a cross-sectional view taken along the line C-C' of FIG. 5A, and the FIG. 6C is a cross-sectional view taken along the line D-D' of FIG. 5A.

In addition, in FIGS. 6A-6C, for ease of description, the conductive line of the first touch sensing cell 311 is indicated by "313a", the conductive line of the first connection pattern 312 is indicated by "313b", the conductive line of the second touch sensing cell 321 is indicated by "313c", and the conductive line of the second connection pattern 322 is indicated by "313d".

Referring to FIG. 6A, the first touch sensing cells 311 may be disposed on the insulation layer 400.

Accordingly, the conductive lines 313a of the first touch sensing cells 311 may be disposed on the insulation layer 400.

Referring to FIG. 6B, the insulation layer 400 may be disposed at an area where the first connection patterns 312 and the second connection patterns 322 overlap each other. For example, the insulation layer 400 may be disposed between the first connection patterns 312 and the second connection patterns 322 such that the first connection patterns 312 and the second connection patterns 322 are not electrically connected to each other (e.g., the insulation layer 400 electrically insulates or isolates the first connection patterns 312 and the second connection patterns 322 from each other). For example, the first connection patterns 312 may be disposed above the insulation layer 400, and the second connection patterns 322 may be disposed below the insulation layer 400.

Accordingly, the conductive lines 313b of the first connection patterns 312 may be disposed above the insulation layer 400, and the conductive lines 313d of the second connection patterns 322 may be disposed below the insulation layer 400.

Referring to FIG. 6C, the second touch sensing cells 321 may be disposed on the insulation layer 400 in the same or substantially the same way that the first touch sensing cells 311 are disposed.

Accordingly, the conductive lines 313c of the second touch sensing cells 321 may be disposed on the insulation layer 400. In addition, the insulation layer 400 may be disposed at an area where the second touch sensing cells 321 and the second connection patterns 322 overlap each other, and the second touch sensing cells 321 and the second connection patterns 322 may be connected to each other through contact openings 318 (e.g., contact holes) formed in the insulation layer 400.

For example, the conductive lines 313d of the second connection patterns 322 may be electrically connected to the conductive lines 313c of the second touch sensing cells 321 through the contact openings 318 formed in the insulation layer 400.

Figure 7:
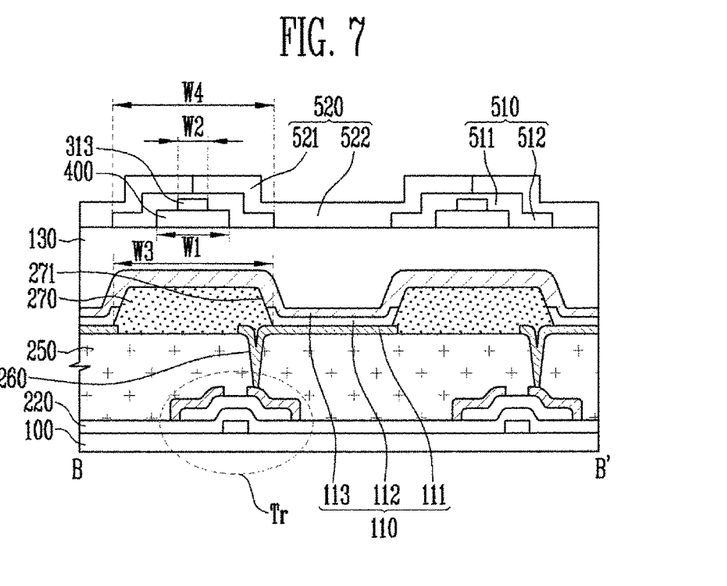
FIG. 7 is a cross-sectional view of a display device according to an exemplary embodiment of the present invention.

FIG. 7 is a cross-sectional view of a display device according to an exemplary embodiment of the present invention.

Referring to FIG. 7, the display device 10 according to the current exemplary embodiment of the present invention may further include a black matrix 510 and color filters 520.

The black matrix 510 may be disposed on the insulation layer 400 and may have a similar mesh structure as that of the insulation layer 400.

A width W4 of the black matrix 510 may be greater than the width W1 of the insulation layer 400. For example, in consideration of a process deviation, the width W1 of the insulation layer 400 may be smaller than the width W4 of the black matrix 510 by greater than 1 µm.

In other embodiments, the width W1 of the insulation layer 400 may be smaller than a width W3 of the pixel definition layer 270 (e.g., the width W1 of the insulation layer 400 may be smaller than a width of the pixel definition layer 270 between adjacent openings therein).

For example, the black matrix 510 may extend toward the encapsulation layer 130 from above the insulation layer 400 at the opposite ends of the insulation layer 400.

For example, the black matrix 510 may include a first portion 511 that is disposed above the insulation layer 400 and a second portion 512 that extends from the first portion 511 to contact the encapsulation layer 130.

A step caused by the insulation layer 400 may exist between the first portion 511 and the second portion 512 of the black matrix 510.

The black matrix 510 and the light emitting element 110 may be related to each other (e.g., respective positions of the black matrix 510 and the light emitting element 110 may be related) such that a viewing angle of the display device 10 decreases as a distance between the black matrix 510 and the light emitting element 110 increases and the viewing angle of the display device 10 increases as the distance between the black matrix 510 and the light emitting element 110 decreases.

Accordingly, the width W1 of the insulation layer 400 may be smaller than the width W3 of the pixel definition layer 270 such that ends of the black matrix 510 (e.g., the second portion 512 of the black matrix 510), which have a greater effect on the viewing angle, may be positioned closer to the light emitting element 110.

Accordingly, the display device 10 according to the aforementioned exemplary embodiment has an improved viewing angle.

In addition, noise is likely to increase as the first touch electrodes 310 and the second touch electrodes 320 come closer to the second electrodes 113 of the light emitting elements 110. In the aforementioned exemplary embodiment, the position of the second portion 512 of the black matrix 510, which is highly related to the viewing angle, may be changed while the position of the first portion 511 related to the positions of the first touch electrodes 310 and the second touch electrodes 320 is maintained (is not changed), thereby maintaining existing touch sensitivity.

In addition, the first touch sensing cells 311, the first connection patterns 312, and the second touch sensing cells 321 may be disposed between the black matrix 510 and the insulation layer 400.

Accordingly, the black matrix 510 may cover (e.g., may completely cover) not only the first touch sensing cells 311, the first connection patterns 312, and the second touch sensing cells 321 that are disposed on the insulation layer 400, but also the insulation layer 400.

Accordingly, an additional passivation layer for protecting the first touch sensing cells 311, the first connection patterns 312, and the second touch sensing cells 321 can be omitted so a manufacturing process can be simplified and a manufacturing cost can be reduced.

The black matrix 510 may use or may include various suitable materials that can be used in the display device.

For example, the black matrix 510 may be formed of a dual layer of chromium (Cr) and $Cr/CrO_x$, a resin including a carbon pigment, black dye, or graphite but is not limited thereto. When the black matrix 510 is a resin including carbon pigment, the carbon pigment may be carbon black, which is a black pigment having a light blocking function, and the black matrix 510 may further include an organic pigment or the like to decrease a dielectric constant of the black matrix 510 and to improve optical density. The black matrix 510 may be made of generally available materials, and a more detailed description thereof may be omitted.

The color filters 520 may be disposed on the encapsulation layer 130. In addition, because the color filters 520 are disposed to overlap the emission layers 112 of the light emitting elements 110, light emitted from the light emitting elements 110 may pass through the color filters 520 to exhibit specific colors.

The color filters 520 may be disposed on the black matrix 510 as well as on the encapsulation layer 130.

For example, the color filters 520 may include a first portion 521 that is disposed on the black matrix 510 and a second portion 522 that extends from the first portion 521 to contact the encapsulation layer 130.

In addition, the color filters 520 may contact adjacent ones of the color filters 520 on the black matrix 510. For example, a pair of adjacent color filters 520 may contact each other such that they are connected to each other. For example, the first portions 521 of the adjacent color filters 520 may contact each other on the black matrix 510.

Figure 8:
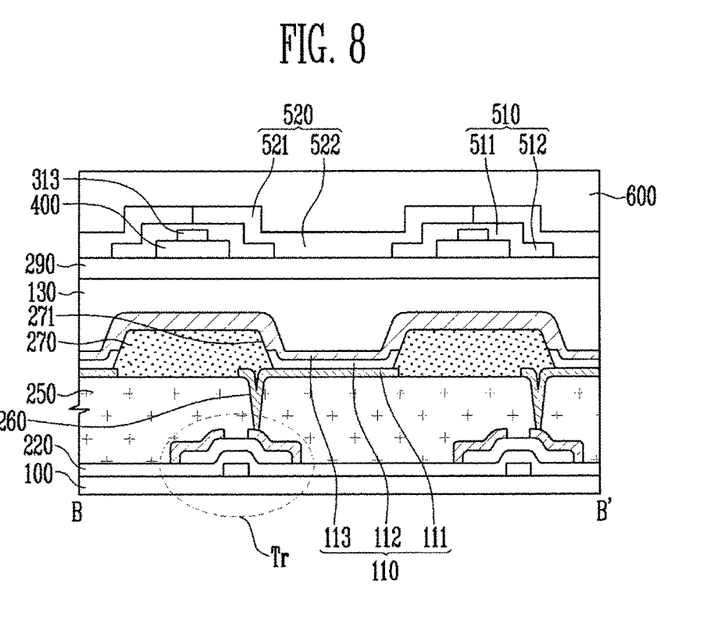
FIG. 8 is a cross-sectional view of a display device according to another exemplary embodiment of the present invention.

FIG. 8 is a cross-sectional view of a display device according to another exemplary embodiment of the present invention.

Referring to FIG. 8, the display device 10 according to the current exemplary embodiment of the present invention may further include a buffer layer 290 and a passivation layer 600.

As described above, the buffer layer 290 may be formed on the encapsulation layer 130 to be between an insulation layer 400 and an encapsulation layer 130.

In such an embodiment, a black matrix 510 may extend toward the buffer layer 290 from above the insulation layer 400 at opposite ends of the insulation layer 400. For example, the black matrix 510 may include a first portion 511 that is disposed above the insulation layer 400 and a second portion 512 that extends from the first portion 511 to contact the buffer layer 290.

In addition, color filters 520 may be disposed on the buffer layer 290. In addition, the color filters 520 may be disposed not only on the buffer layer 290 but also on the black matrix 510.

For example, the color filters 520 may include a first portion 521 disposed on the black matrix 510 and a second portion 522 that extends from the first portion 521 to contact the buffer layer 290.

The passivation layer 600 may be disposed on the color filters 520 to planarize an upper part (e.g., an upper surface) of the display device 10.

The passivation layer 600 may implemented as an organic insulating layer including an organic material or an inorganic insulating layer including an inorganic material.

FIG. 8 shows an exemplary embodiment in which both the buffer layer 290 and the passivation layer 600 are included, but in other embodiments, the buffer layer 290 and/or the passivation layer 600 may be omitted.

It will be understood by those skilled in the art that the present invention may be embodied in other specific forms without departing from the scope or spirit thereof.

It is therefore to be understood that the exemplary embodiments described above are illustrative in all aspects and not restrictive. The scope of the present invention is defined by the appended claims and their equivalents rather than the detailed description, and all changes or modifications derived from the meaning and scope of the claims and their equivalents should be interpreted as being included in the scope of the present invention.

What is claimed is:

1. A display device comprising: a plurality of light emitting elements;
   a pixel definition layer having a plurality of openings defining positions of the light emitting elements;
   an encapsulation layer on the light emitting elements and the pixel definition layer;
   an insulation layer on the encapsulation layer and having a smaller width than a portion of the pixel definition layer between two adjacent openings therein; and
   a plurality of touch sensing cells on the insulation layer, wherein each of the light emitting elements comprises a first electrode exposed through one of the openings in the pixel definition layer, an emission layer on the first electrode, and a second electrode on the emission layer.

2. The display device of claim 1, wherein the insulation layer overlaps the pixel definition layer.

3. The display device of claim 1, further comprising a black matrix having a greater width than the insulation layer and covering the insulation layer and the touch sensing cells.

4. The display device of claim 3, wherein the black matrix overlaps the pixel definition layer.

5. The display device of claim 3, further comprising a plurality of color filters on the encapsulation layer and the black matrix.

6. The display device of claim 5, wherein adjacent ones of the color filters contact each other on the black matrix.

7. The display device of claim 1, wherein the insulation layer does not overlap the first electrode of the light emitting elements.

8. The display device of claim 1, wherein the touch sensing cells comprise a plurality of first touch sensing cells connected to each other by first connection patterns along a first direction and a plurality of second touch sensing cells connected to each other by second connection patterns along a second direction.

9. The display device of claim 8, wherein the first and second touch sensing cells and the first and second connection patterns overlap the insulation layer.

10. The display device of claim 8, wherein the first and second touch sensing cells and the first and second connection patterns overlap the insulation layer when viewed from the top and have substantially the same shape as the insulation layer.

11. The display device of claim 8, wherein the second connection patterns are below the insulation layer and are connected to the second touch sensing cells through contact openings in the insulation layer.

12. The display device of claim 1, wherein the insulation layer comprises an organic insulating layer.

13. The display device of claim 1, further comprising a buffer layer between the encapsulation layer and the insulation layer.

14. The display device of claim 1, wherein the touch sensing cells comprise conductive lines having a mesh shape.

15. The display device of claim 14, wherein the conductive lines of the touch sensing cells have a smaller width than the insulation layer.

16. The display device of claim 1, wherein the insulation layer has a mesh shape.

* * * * *